United States Patent [19]
Satoh

[11] Patent Number: 5,465,073
[45] Date of Patent: Nov. 7, 1995

[54] DIFFERENTIAL AMPLIFIER ADAPTED TO BE INTEGRATED IN C-MOS MONOLITHIC IC

[75] Inventor: Noritoshi Satoh, Tokyo, Japan

[73] Assignee: NEC Corporation, Tokyo, Japan

[21] Appl. No.: 289,746

[22] Filed: Aug. 12, 1994

[30] Foreign Application Priority Data

Aug. 25, 1993 [JP] Japan ................... 5-232284

[51] Int. Cl.⁶ ................... H03F 3/45
[52] U.S. Cl. ................... 330/258; 330/253; 330/257
[58] Field of Search ................... 330/253, 257, 330/258

[56] References Cited

U.S. PATENT DOCUMENTS

| | | | |
|---|---|---|---|
| 4,533,876 | 8/1985 | Haque et al. | 330/253 |
| 4,818,929 | 4/1989 | Sonntag et al. | |
| 5,006,817 | 4/1991 | Babanezhad | 330/253 |
| 5,015,966 | 5/1991 | McIntyre | 330/253 |
| 5,321,370 | 6/1994 | Yukawa | 330/258 |

FOREIGN PATENT DOCUMENTS

| | | |
|---|---|---|
| 0286347 | 12/1988 | European Pat. Off. . |
| 244404 | 10/1990 | Japan . |
| 9305572 | 3/1993 | WIPO ................... 330/258 |

OTHER PUBLICATIONS

Neues aus der Technik, No. 1, Feb. 20, 1987, p. 1, Chapter "Operational Amplifier" (English language translation also provided).

Primary Examiner—James B. Mullins

[57] ABSTRACT

A differential amplifier includes an input stage differential amplifier circuit and an output stage differential amplifier circuit. Differential common-mode output voltages of the output stage differential amplifier circuit are converted into common-mode currents by transistors having sources connected in common. The common-mode currents are taken as input mirror currents of a current mirror circuit. Output mirror currents of the current mirror circuit are supplied to the drain side as output electrode of a constant current transistor of the input stage differential amplifier circuit to form a common-mode feedback circuit. Since the common-mode feedback circuit is constructed only by the common-mode voltage/current converting transistors and the current mirror circuit, the feedback paths can be reduced to establish a transfer function with a single pole for stability of operation of the differential amplifier.

6 Claims, 3 Drawing Sheets

DIFFERENTIAL AMPLIFIER ADAPTED TO BE INTEGRATED IN C-MOS MONOLITHIC IC

BACKGROUND OF THE INVENTION

1. Field of the Invention

The present invention relates generally to a differential amplifier. More specifically, the invention relates to a differential amplifier adapted to be integrated in C-MOS monolithic IC.

2. Description of the Related Art

An example of a differential amplifier of C-MOS structure having a conventional common-mode feedback circuit has been disclosed in Japanese Patent Publication No. 2-44404. The circuit disclosed in the foregoing publication will be discussed with reference to FIG. 3.

Differential inputs 101 and 102 are applied to respective gate electrodes of NMOS transistors 1 and 2 as differential transistors having sources connected in common. A constant current NMOS transistor 5 is provided for supplying a constant current to a common junction of the sources of the NMOS transistors 1 and 2. A bias is applied to the gate of the NMOS transistor 5. PMOS transistors 3 and 4 are active loads of the transistors 1 and 2, respectively.

With these transistors 1 to 5, an input stage differential amplifier 200 is formed. A differential amplifier output of this input stage differential amplifier 200 is obtained from respective drains of the transistors 1 and 2.

The input stage differential amplifier output serves as a differential input of an output stage differential amplifier 201. The input stage differential amplifier output is thus applied to respective gate inputs of a pair of PMOS transistors 6,7 having source connected in common. As active loads for a pair of transistors 6 and 7, NMOS transistors 8 and 9 are provided. A bias 106 is applied to the gates of the transistors 8 and 9.

The amplifier outputs 103 and 104 of the output stage differential amplifier 201 are output through respective drains of the transistors 6 and 7. The signal at the differential inputs 101 and 102 is amplified to be obtained through the differential outputs 103 and 104.

Next, discussion will be given for the common-mode feedback circuit. PMOS transistors 10, 11 which take the differential outputs (drain outputs of the transistors 1 and 2) as gate inputs and convert the differential output voltages into current, are provided. The drain outputs of the transistors 10 and 11 are connected in common for current composition. The composite current corresponds to a common mode output voltage of the input stage differential amplifier.

The composite current of a pair of common-mode current generating transistors 10 and 11 is an input mirror current of a current mirror circuit 202. The current mirror circuit 202 comprises NMOS transistors 12 and 13. The composite current is supplied to the drain of the transistor 12. An output mirror current is generated at the drain of the transistor 13.

The output mirror current is supplied to the drain of a PMOS transistor 17. Here, since another current mirror circuit is formed by the transistor 17 and the active load transistors 3 and 4, the common-mode output voltage appearing at the respective drain of the transistors 3 and 4 as the output mirror current are fed back.

By providing common-mode feedback, variation of a common-mode output of the differential amplifier can be suppressed.

It should be noted that transistors 20 and 22 and capacitors 21 and 23 form a frequency compensation circuit, and the transistors 20 and 22 are adapted to serve as resistor employing depression type MOS.

Such conventional common-mode feedback circuit has three paths, i.e. the voltage-current converting portion of the transistors 10 and 11, the current mirror circuit portion of the transistors 12 and 13 and the current mirror portion of the transistors 17, 3 and 4. Therefore, the common-mode feedback circuit is equivalent to two stage amplifier construction. Accordingly, the transfer function between the input and output of the common-mode feedback circuit becomes a transfer function having two poles to make common-mode feedback unstable and to case oscillation in the worst case.

SUMMARY OF THE INVENTION

Therefore, it is an object of the present invention to provide a differential amplifier which can reduce signal paths in a common-mode feedback circuit and thus permit stable operation of the common-mode feedback circuit.

Another object of the present invention is to provide a differential amplifier which can provide a transfer characteristics of the common-mode feedback circuit expressed by a transfer function having a single pole.

In order to accomplish the above-mentioned and other objects, a differential amplifier, according to one aspect of the invention, comprises:

an input stage differential amplifier circuit for amplifying a differential input signal;

an output stage differential amplifier circuit taking the differential output of the input stage differential amplifier as a differential input;

first and second common-mode current generating transistors receiving differential outputs of the input stage differential amplifier at respective controlling electrode and generating common-mode currents corresponding to the received differential outputs;

a current mirror circuit inputting a composite current of the common-mode current generated by the first and second common-mode current generating transistors: and composing means for feeding back a current corresponding to an output mirror current of the current mirror circuit to a constance current source of the input stage differential amplifier circuit and composing therewith.

According to another aspect of the invention, a differential amplifier comprises:

an input stage differential amplifier circuit amplifying a differential input signal;

an output stage differential amplifier circuit taking the differential output of the input stage differential amplifier circuit as a differential input;

first and second common-mode current generating transistors receiving the differential outputs of the input stage differential amplifier circuit at respective controlling electrodes and generating common-mode currents corresponding to the differential outputs:

a current mirror circuit inputting a composite current of the common-mode currents generated by the first and second common-mode current generating transistors and generating a pair of output mirror currents; and composing means for feeding back currents corresponding to the pair of output mirror currents to the pair of differential output terminals of the input stage differential amplifier circuit.

BRIEF DESCRIPTION OF THE DRAWING

The present invention will be understood more fully from the detailed description given herebelow and from the accompanying drawings of the preferred embodiment of the present invention, which, however, should not be taken to be limitative to the invention, but are for explanation and understanding only.

In the drawings.

DESCRIPTION OF THE PREFERRED EMBODIMENT

The present invention will be discussed hereinafter in detail in terms of the preferred embodiments with reference to FIGS. 1 and 2. In the following description, numerous specific details are set forth in order to provide a thorough understanding of the present invention. It will be obvious, however, to those skilled in the art that the present invention may be practiced without these specific details. In other instance, well-known structures are not shown in detail in order to unnecessary obscure the present invention.

Figure 1:
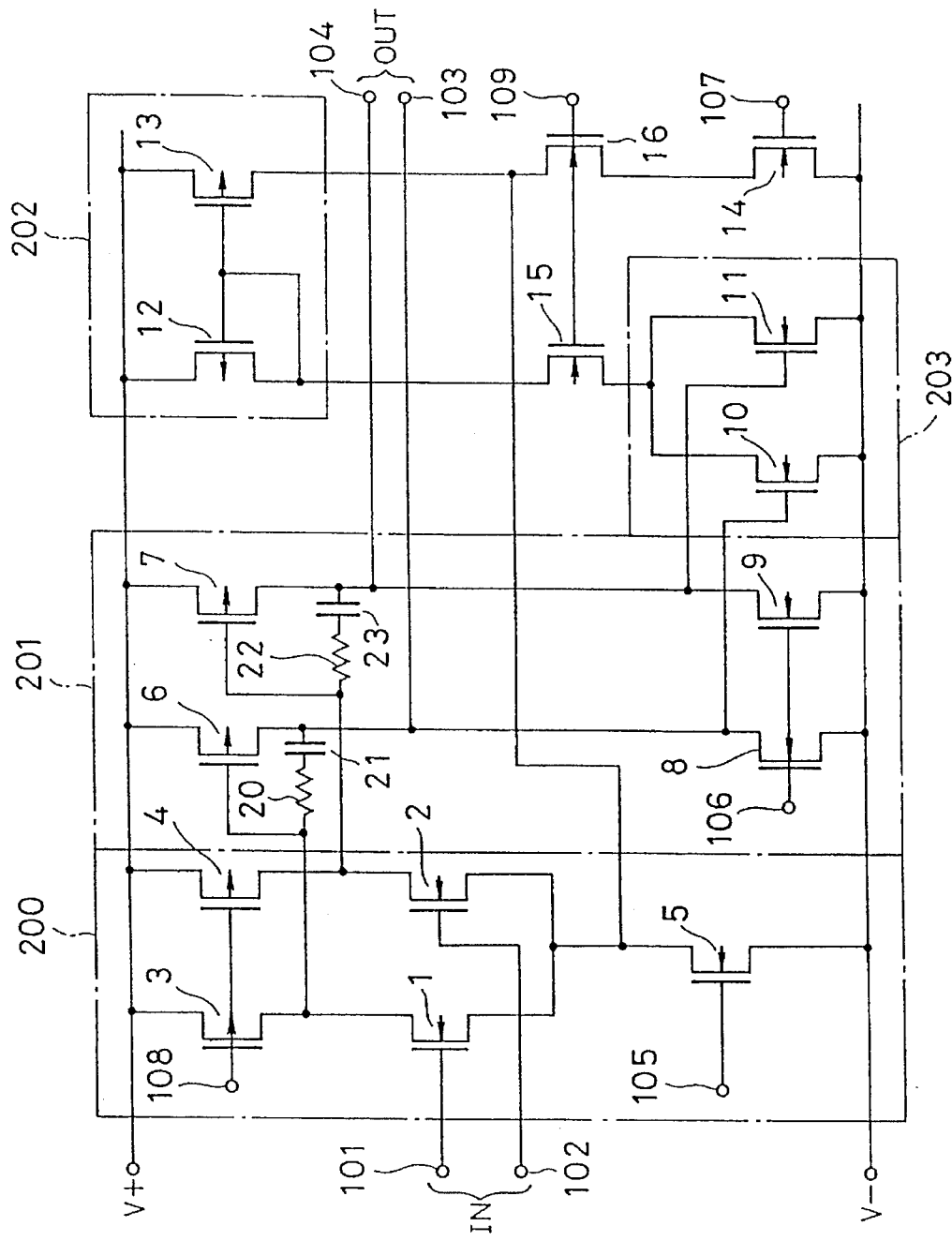
FIG. 1 is a circuit diagram of one embodiment of a differential amplifier according to the present invention.

FIG. 1 is a circuit diagram of the preferred embodiment of a differential amplifier according to the present invention. In FIG. 1, like reference numerals represent like element to FIG. 3. In the shown construction, the constructions of the input stage differential amplifier 200 and the output stage differential amplifier 201 are the same as those in the circuit of FIG. 3.

Figure 3:
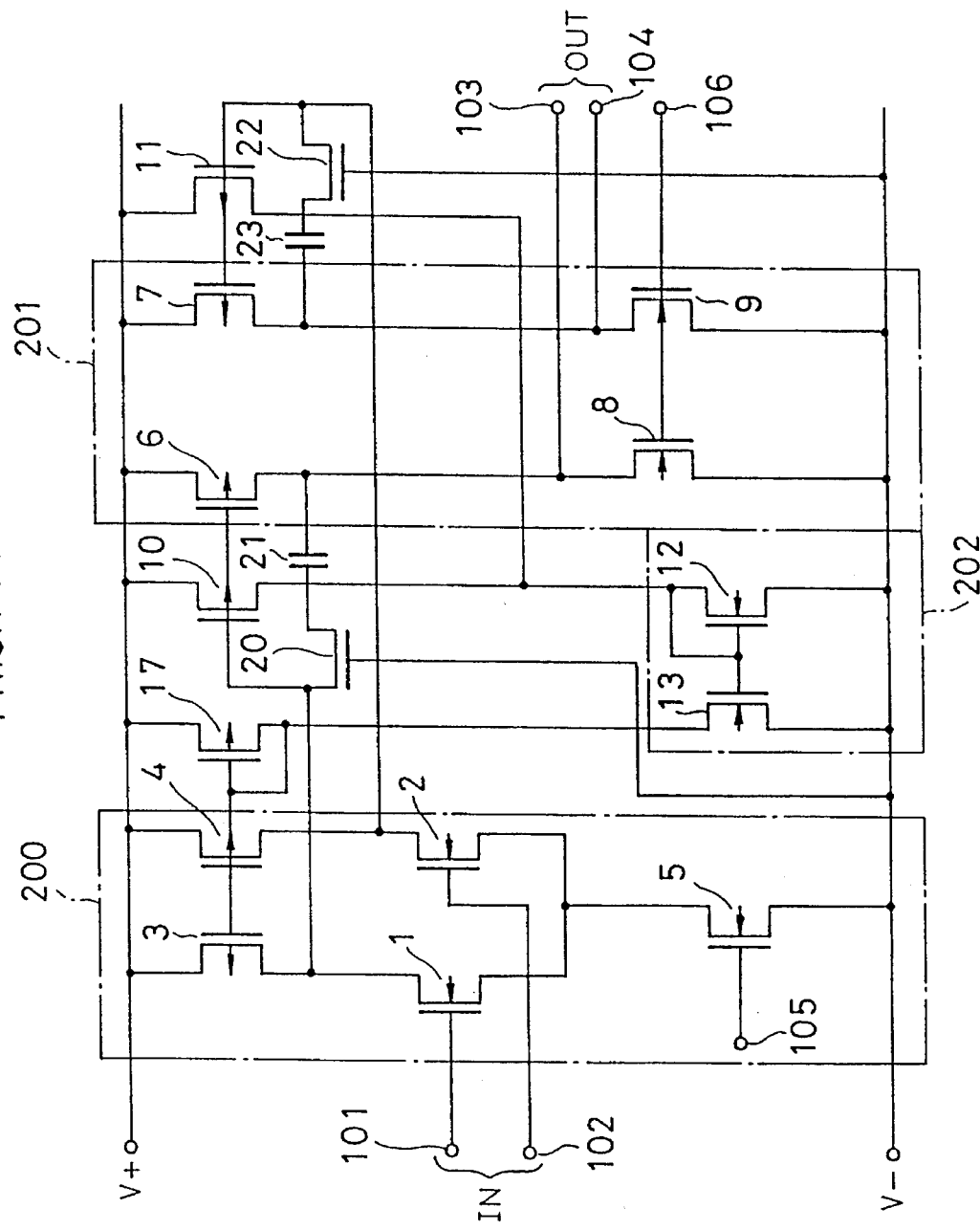
FIG. 3 is a circuit diagram of a common-mode feedback circuit of the conventional differential amplifier.

It should be noted that while the elements of the frequency compensation circuit are illustrated with resistors 20 and 22, they are constructed by utilizing depression type MOS similarly to those of FIG. 3.

Discussion will be given for a common-mode feedback circuit. In the shown embodiment, the differential 103 and 104 of the output stage differential amplifier 201 are applied to gates (control electrodes) of common-mode current generating NMOS transistors 10 and 11 of a voltage/current converting portion 203. Accordingly, currents corresponding to the common-mode output of the differential output voltage is generated by the transistors 10 and 11.

These common-mode currents are composed at the source (common electrode) of the NMOS transistor 15 and output as composite common-mode current through the drain (output electrode) thereof. It should be noted that the transistor 15 generates a drain voltage of the transistors 10 and 11 by applying a bias 109 to the gate thereof.

The composite common-mode current output of the transistor 15 serves as input mirror current of the current mirror circuit 202. The current mirror circuit 202 comprises PMOS transistors 12 and 13, in which the input mirror current is supplied to the drain of the transistor 12 and the output mirror current is generated at the drain of the transistor 13.

As the output load of the current mirror circuit 202, a series circuit of NMOS transistors 14 and 16 is employed. The transistor 14 is applied a constant gate bias 107 and generates a common-mode reference current. The transistor 16 is also applied the constant gate bias 109 and generates a drain voltage of the transistor 14.

A difference between the output current mirror current (composite common-mode current) of the current mirror circuit 202 and the common-mode reference current of the transistor 14 is fed back to the drain of the constant current source transistor 5 of the input stage differential amplifier 200. By this, variation of the common-mode output of the differential outputs 103 and 104 can be suppressed similarly to the prior art of FIG. 3.

However, in the shown embodiment, the common-mode feedback circuit comprises only the voltage/current converting portion 203 and the current mirror circuit 202. Therefore, the common-mode feedback circuit is equivalent to a single stage amplifier. Accordingly, the transfer characteristics can be expressed by a transfer function having a single pole and thus becomes stable.

Figure 2:
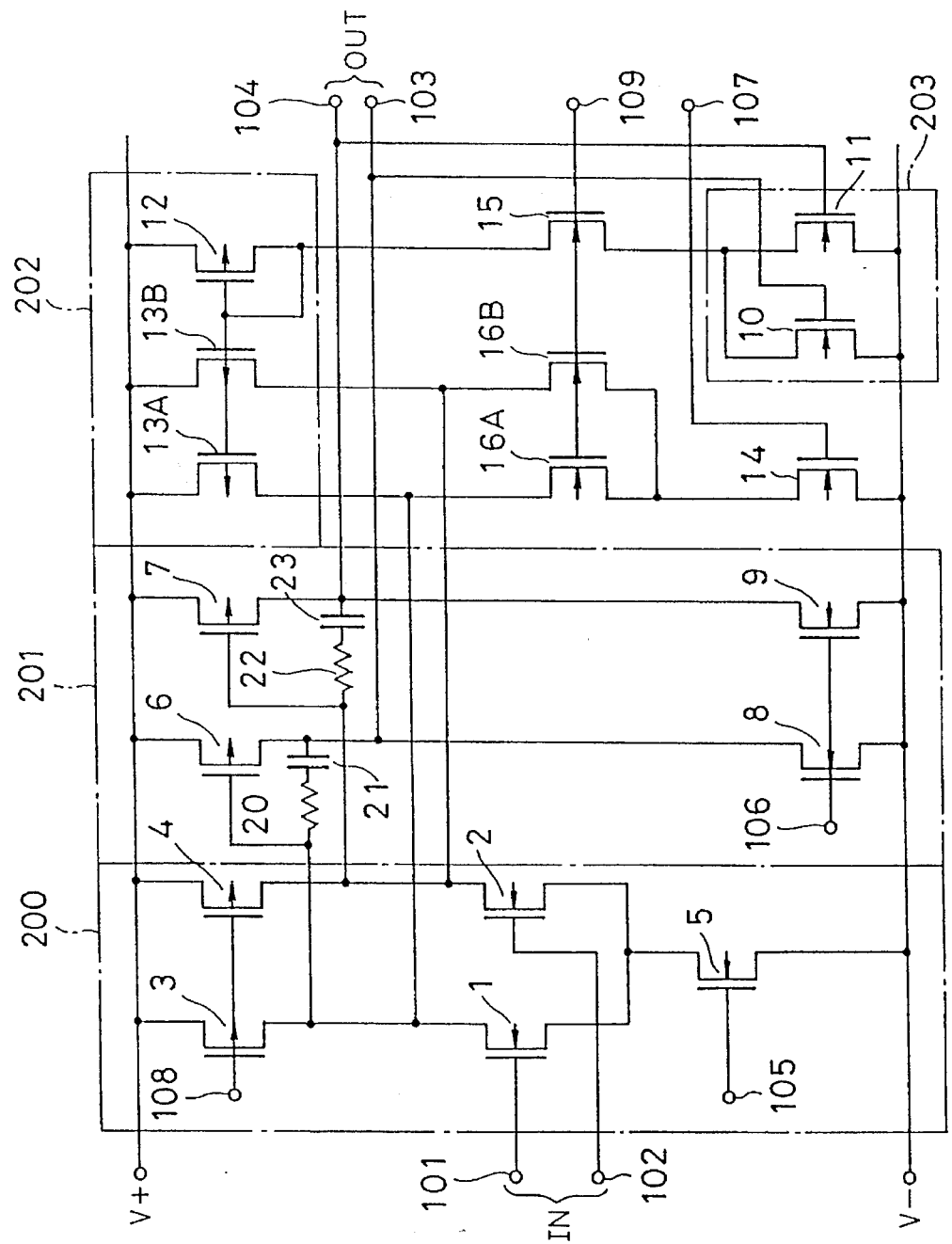
FIG. 2 is a circuit diagram of another embodiment of a differential amplifier according to the invention.

FIG. 2 shows a circuit diagram of another embodiment of the differential amplifier circuit according to the invention. Here, like reference numerals represent like elements to FIG. 1. The shown embodiment of the common-mode feedback circuit is basically the same as that of FIG. 1. However, in the shown construction, the transistor 13 for generating the output mirror current of the current mirror circuit 202 is replaced with two transistors 13A and 13B. Correspondingly, the common-mode reference current generating transistor 16 which serves as drain load for the transistors 13A and 13B is replaced with two transistors 16A and 16B.

Differences between respective common-mode current of the transistors 13A and 13B and respective common-mode reference current of the transistors 16A and 16B are fed back to the differential outputs (drain outputs of the transistors 1 and 2) of the input stage differential amplifier 200.

Even in the shown embodiment, since the common-mode feedback circuit may have the transfer characteristics with the single pole as in the former embodiment, the feedback circuit becomes stable.

As set forth above, according to the present invention, since the common-mode feedback circuit of the differential amplifier is constructed only with the common-mode current generating portion and the current mirror circuit, the signal paths between the input and output can be reduced to permit stable feedback operation.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. A differential amplifier comprising:

an input stage differential amplifier circuit for amplifying a differential input signal;

an output stage differential amplifier circuit taking the differential output of said input stage differential amplifier as a differential input;

first and second common-mode current generating transistors receiving differential outputs of said output stage differential amplifier circuit at respective controlling electrodes and generating common-mode currents corresponding to the received differential outputs;

a current mirror circuit inputting a composite current of the common-mode current generated by said first and second common-mode current generating transistors; and composing means for feeding back a current corresponding to an output mirror current of said current mirror circuit to a constant current source of said input stage differential amplifier circuit and composing therewith, said composing means including reference current generating transistor having a controlling electrode applied with a constant bias, and a differential current of the reference current and said output mirror current being fed back to the constant current source of said input stage differential amplifier circuit for composition, wherein said input stage differential amplifier circuit comprises a first pair of differential transistors supplied with the differential input signal at controlling electrodes, a constant current transistor supplying an operation current for said first pair of differential transistors, and a pair of load transistors connected between an output electrode of said first pair of differential transistors and a first power source and serving as active loads for said first pair of differential transistors; and said output stage differential amplifier circuit comprises a second pair of differential transistors supplied with the differential outputs of said input stage differential amplifier circuit at controlling electrodes thereof and having a common electrode connected to said first power source, and a pair of load transistors connected between said second pair of differential transistors and a second power source and serving as active loads for said second pair of differential transistors.

2. A differential amplifier as set forth in claim 1, wherein said differential current is composed with an output constant current of said constant current transistor.

3. A differential amplifier as set forth in claim 2, wherein said first and second common-mode current generating transistors have the controlling electrodes applied with the differential outputs of said output stage differential amplifier circuit, a common electrode connected to said second power source and output electrodes connected in common, and said composite current is output from said output electrodes connected in common.

4. A differential amplifier comprising:

an input stage differential amplifier circuit amplifying a differential input signal;

an output stage differential amplifier circuit taking the differential output of said input stage differential amplifier circuit as a differential input;

first and second common-mode current generating transistors receiving differential outputs of said output stage differential amplifier circuit at respective controlling electrodes and generating common-mode currents corresponding to said differential outputs;

a current mirror circuit inputting a composite current of said common-mode currents generated by said first and second common-mode current generating transistors and generating a pair of output mirror currents; and composing means for feeding back currents corresponding to said pair of output mirror currents to a pair of differential output terminals of said input stage differential amplifier circuit;

said composing means including a pair of reference current generating transistors, and differential currents of a pair of reference currents and said pair of output mirror currents being fed back to said pair of differential output terminals of said input stage differential amplifier circuit, wherein said input stage differential amplifier circuit comprises a first pair of differential transistors supplied with the differential input signal at controlling electrodes, a constant current transistor supplying an operation current for said first pair of differential transistors, and a pair of load transistors connected between an output electrode of said first pair of differential transistors and a first power source and serving as active loads for said first pair of differential transistors; and said output stage differential amplifier circuit comprises a second pair of differential transistors supplied with the differential outputs of said input stage differential amplifier circuit at controlling electrodes thereof and having a common electrode connected to said first power source, and a pair of load transistors connected between said second pair of differential transistors and a second power source and serving as active loads for said second pair of differential transistors.

5. A differential amplifier as set forth in claim 4, wherein respective one of said differential currents are supplied to the output electrodes of said first pair of differential transistors.

6. A differential amplifier as set forth in claim 5, wherein said first and second common-mode current generating transistors have the controlling electrodes applied with the differential outputs of said output stage differential amplifier circuit, a common electrode connected to said second power source and output electrodes connected in common, and said composite current is output from said output electrodes connected in common.

* * * * *